United States Patent [19]

Tigges et al.

[11] Patent Number: 4,864,156
[45] Date of Patent: Sep. 5, 1989

[54] PROXIMITY SWITCH WITH NONCONTACT EFFECT

[75] Inventors: Burkhard Tigges, Sundern; Dierk Brasse, Schalksmuehle, both of Fed. Rep. of Germany

[73] Assignee: Werner Turck GmbH & Co. KG., Halver, Fed. Rep. of Germany

[21] Appl. No.: 232,468

[22] Filed: Aug. 15, 1988

[30] Foreign Application Priority Data

Aug. 13, 1987 [DE] Fed. Rep. of Germany ....... 8711035

[51] Int. Cl.$^4$ .......................................... H01H 35/00
[52] U.S. Cl. ................................... 307/117; 340/565; 307/116
[58] Field of Search ............... 307/117, 116; 340/565; 361/181

[56] References Cited

FOREIGN PATENT DOCUMENTS 2817020 3/1986 Fed. Rep. of Germany .

Primary Examiner—William M. Shoop, Jr.
Assistant Examiner—Sharon D. Logan
Attorney, Agent, or Firm—Antonelli, Terry & Wands

[57] ABSTRACT

A proximity switch with a noncontact effect which includes a plug-in adapter having a plug-in socket for the sensor part equipped with a plug-in cable, a ac/dc converter with a core coil connected in front thereof being arranged in the adapter. The adapter is associated with a dc/ac converter located in the basic housing of the main part and includes a core coil connected thereafter. The core coil lie in each case behind the mounting sides of the basic housing and plug-in adapter and transmit by inductive coupling the energy from the main part to the connected sensor part and the signals from the sensor part to the main part.

5 Claims, 4 Drawing Sheets

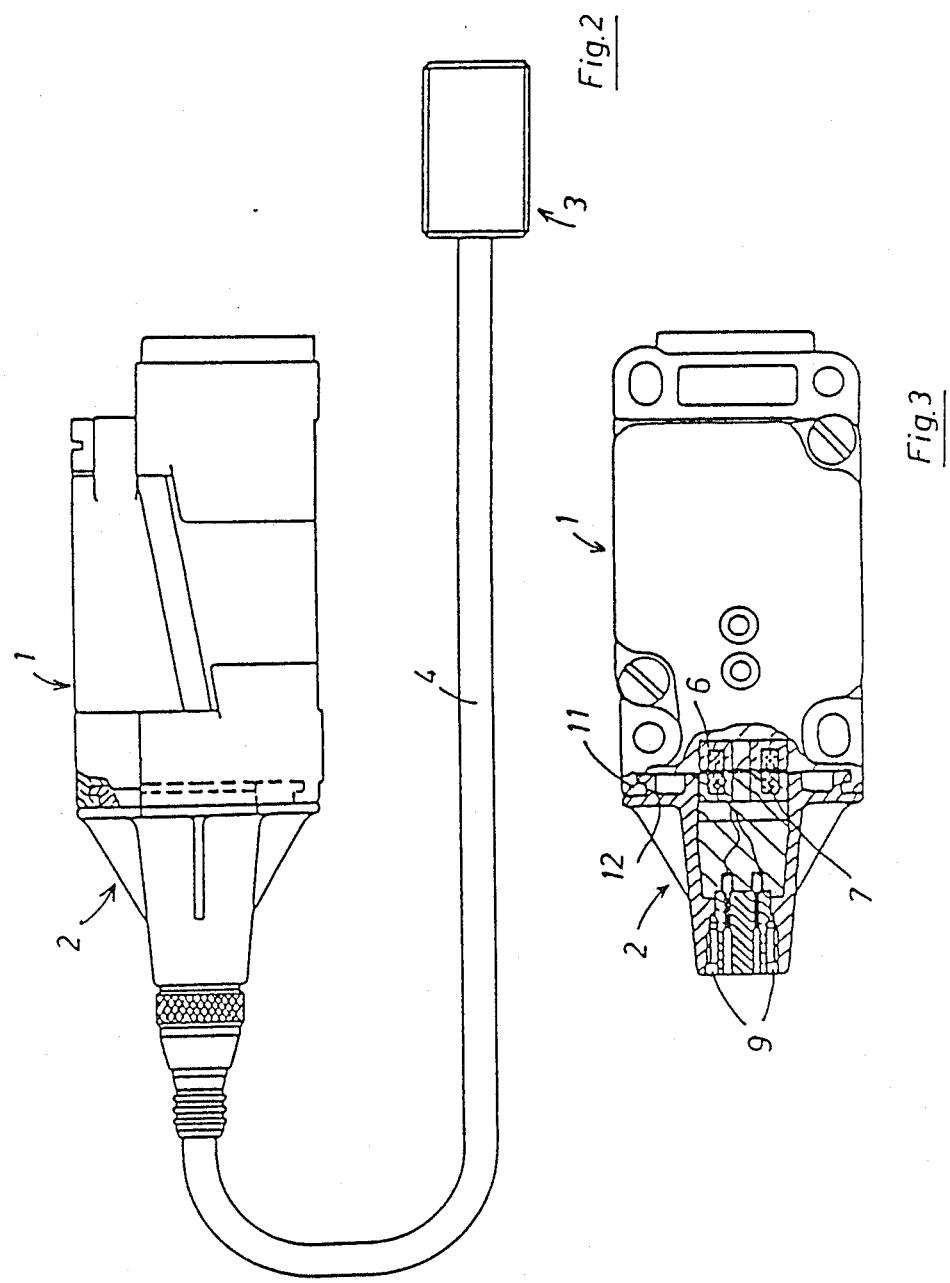

PROXIMITY SWITCH WITH NONCONTACT EFFECT

BACKGROUND OF THE INVENTION

The present invention relates to a proximity switch operating in noncontact fashion with a dc circuit arrangement lying between the input section and the sensor field generator, with the circuit arrangement being divided into a main part arranged in a basic housing on the terminal side, and into a sensor part exhibiting the sensor field generator.

German Pat. No. 2,817,020 discloses a proximity switch wherein the sensor part is accommodated in a square or cubic component that can be threaded or plugged onto the square or cylindrical main part in a rotatable fashion or in various positions. It is thereby possible to align the response side of the sensor part in correspondence with the approach direction of the object to be monitored without having to reposition the main part of the proximity switch, also called power block. Thereby, the aligned mounting of the proximity switch at machines or the like is facilitated especially in case of cramped space conditions. However, in this arrangement, the main part must also be attached in the closest proximity to the monitoring site at machines or the like, and for this reason an appropriate amount of space must there be available; however, this is not realizable in all cases. Since the main part is frequently supplied with mains voltage, whereas the sensor part is operated only with low-voltage current, the mains voltage is carried up to the monitoring site which can give rise to safety problems.

The invention is based on the object of providing a proximity switch usable even under very much restricted installation conditions at the measuring and/or monitoring site, which switch can be mounted in a simple way and wherein the sensor part, operated with a weak current, is protected in a particularly reliable fashion against the supply voltage, e.g. mains voltage, of the main part.

In order to attain this object, the invention provides a plug-in adapter exhibiting a plug-in socket for the sensor part which latter is equipped with a plug-in cable, an ac/dc converter with a core coil connected in front thereof being arranged in this adapter, and the latter being associated with a dc/ac converter located in the basic housing of the main part and having a core coil connected thereafter, the core coils lying in each case behind the mounting sides of basic housing and plug-in adapter and transmitting, by inductive coupling, the energy from the main part to the connected sensor part and the signals from the sensor part to the main part.

A number of advantages are attained by the invention. On the one hand, a complete electric separation is achieved between, on the one hand, the main part and, on the other hand, the plug-in adapter and the sensor part which latter thus can be installed, with the use of a plug-in cable of appropriate length, at a remote distance from the monitoring point. Since the plug-in adapter is likewise attached to the main part, the sensor part, in this case containing merely the sensor coil and electronic components required for sensor field generation and signal evaluation, can be made of a very compact size so that it can be still accommodated even in case of very cramped space conditions. The plug-in connection between sensor part and plug-in adapter facilitates mounting since in this case sensor parts can be utilized having correspondingly long plug-in cables and, if necessary, also extension cables, and anyway the sensor part can be exchanged for another one in an extremely simple way. A further advantage of the invention resides in the fact that the main part can also be used as a module of an only bipartite proximity switch wherein the other module forming the sensor part and having a cube shape, for example, is equipped with a corresponding ac/dc converter and can be connected to the main part in placed of the plug-in adapter. Even in such a case, there still exists a complete electrical separation between the two modules.

Advantageously, according to the present invention, the housing of the plug-in adapter includes a base plate attachable to the basic housing and a truncated cone integrally formed at the rear side of the base plate and surrounding the plug-in socket. The plug-in socket and plug of the plug-in cable are fashioned as connector plugs that can be threaded together.

Furthermore, advantageously, according to the present invention, a plug-in adapter includes a smoothing capacitor connected after the ac/dc converter.

Additionally, the basic housing of the main part is provided, according to the present invention, at a mounting side thereof, with a dovetail hookup recess. The plug-in adapter includes a square head on its mounting side, with the square head being undercut on all sides and insertable in the dovetail hookup recess.

Moreover, according to the present invention, an open end of the dovetail hook-up recess may be closed by a pressure member extending over the square head of the plug-in adapter and can be attached by threading.

The subject matter of the present invention will be described in greater detail below with reference to the accompanying drawings.

BRIEF DESCRIPTION OF THE DRAWINGS

FIG. 2 is a top view of the proximity switch of FIG. 1 in an assembled condition;

FIG. 3 is a top partial cross-sectional view of a main part of the proximity switch a plug-in adapter attached thereto;

DETAILED DESCRIPTION

Figure 1:
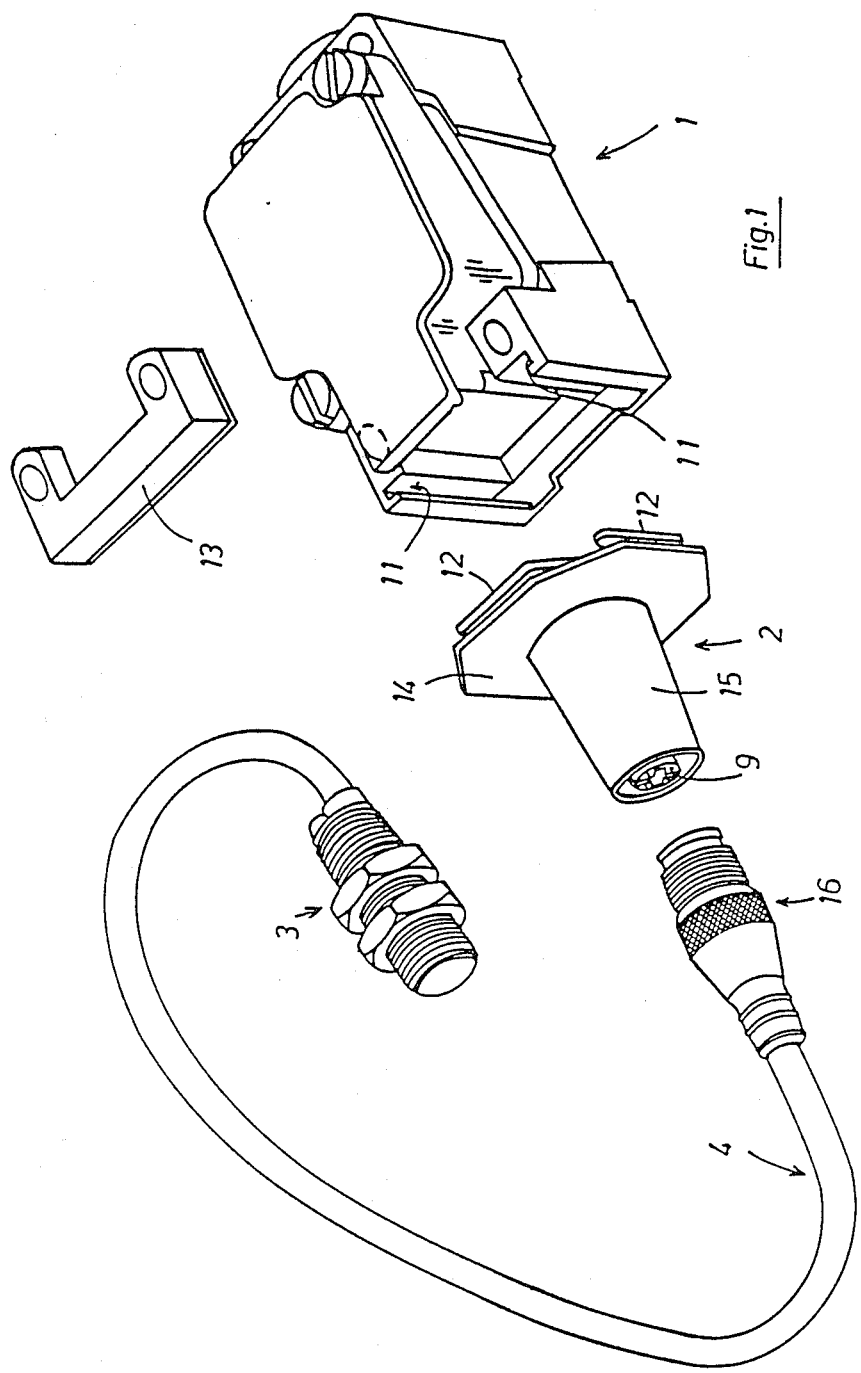
FIG. 1 is a exploded view of a proximity switch constructed in accordance with the present invention.

As shown in FIGS. 1-3, a proximity switch includes a main part generally designated by the reference numeral 1 connectable to the supply voltage, e.g. a source of dc current, or mains voltage, a plug-in adapter generally designated by the reference numeral 2, and a sensor part generally designated by the reference numeral 3, with a plug-in cable generally designated by the reference numeral 4.

Figure 4:
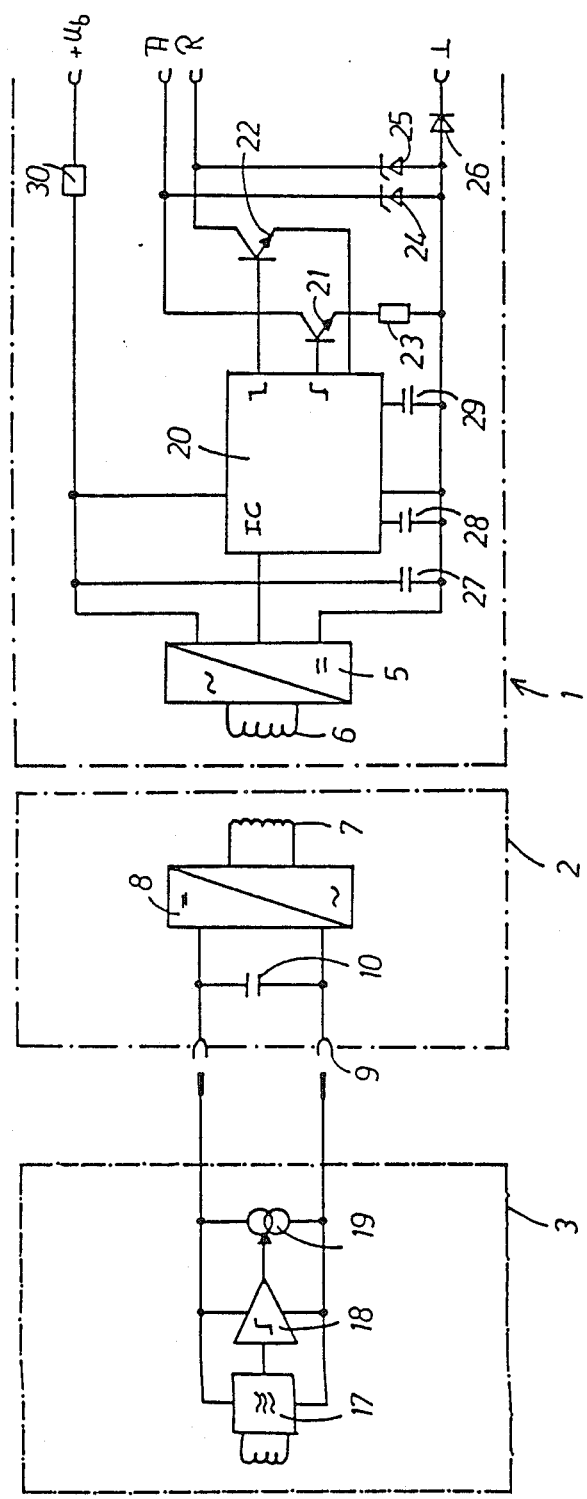
FIG. 4 is a circuit diagram of the proximity switch of FIGS. 1-3, illustrating the subdivision of the individual circuit elements among the components of the proximity switch.
Figure 5:
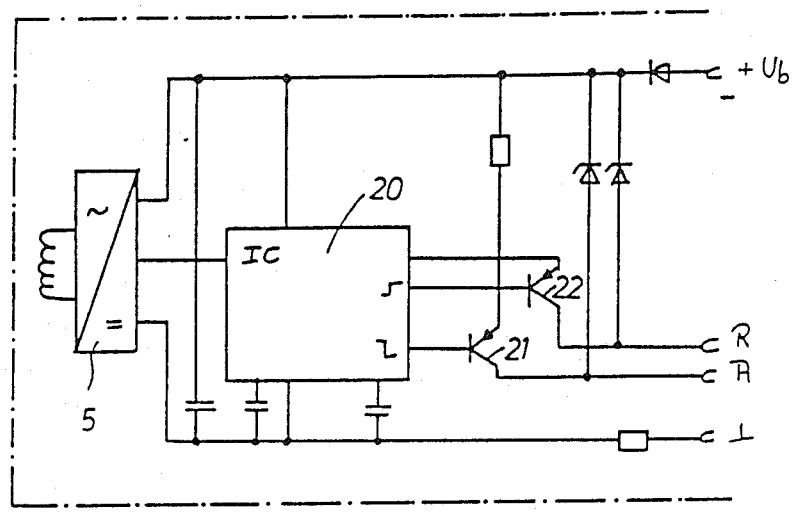
FIG. 5 is a further circuit diagram of the main part of the proximity switch of the present invention.
Figure 6:
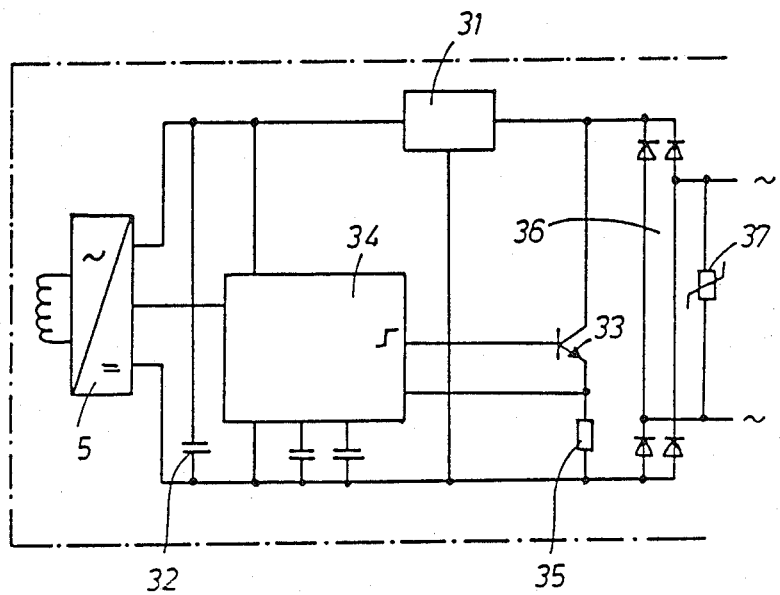
FIG. 6 is a yet another circuit diagram for the main part of the proximity switch of the present invention.

Referring to FIGS. 4, 5 and 6 the main part 1 initially provides a dc operating voltage for the sensor part 3, with the voltage being converted into an alternating current by way of a dc/ac converter 5. By way of a core coil 6 connected after the converter 5, the energy is coupled inductively into a core coil 7 arranged in the adapter 2. An ac/dc converter 8 is connected after the coil 7, with the dc output of the converter 8 being applied to the plug-in sockets 9 of the plug-in adapter. A smoothing capacitor is arranged in the plug-in adapter between the two output leads. The core coils 6, 7 are each arranged at the mounting sides of the main part 1 and plug-in adapter 2.

As shown in FIGS. 1 and 3, a dovetail hookup recess 11 is provided on the mounting side of the main part 1. The plug-in adapter 2, provided with an undercut head 12, can be inserted into the recess 11. The open end of the dovetail hookup recess 11 can be closed off by a pressure member 13 (FIG. 1) extending over the head 12 of the plug-in adapter 2 and being threadable to the main part 1. The housing of the plug-in adapter 2 includes a base plate 14 having the square head 12 on a mounting side thereof, with a truncated cone 15 being integrally formed on the rear side of the base plate 14 and surrounding the plug-in socket 9. The plug-in socket 9 and the plug 16 of the sensor part 3 are fashioned as a connector plug that can be joined by threading. The plug-in socket 9 and the plug 16 of the sensor part 3 are fashioned as a connector plug that can be joined by threading.

The sensor part 3 is constructed so that a current consumption thereof varies in a defined fashion as a function of the control element distance. Under practical conditions, this is accomplished, for example, in the manner shown in FIG. 4 by an oscillator 17 and a comparator 18 along with a controllable current sink 19, housed in the sensor part 3. The signals supplied by the sensor part 3 are transmitted via the plug-in adapter 2 and from there likewise by way of inductive coupling back to the main part 1 and can be derived at that point at terminals A and R. In place of the arrangement of the sensor part 3 shown in FIGS. 4, it is also possible to use at that point a special oscillator, the intrinsic current consumption of which is dependent on the degree of damping.

In the circuit diagrams for the main part 1 shown in FIGS. 4 and 5, the dc/ac converter 5 produces an alternating voltage from the supply voltage $+U_b$ which is transmitted in transformer fashion through its housing to the plug-in adapter 2.

The reactive effect of the sensor part 3, connected via the plug-in adapter 2, permits the switching circuit 20 in the main part 1 to draw conclusions regarding the degree of damping of the oscillator 17 and, respectively, regarding the instantaneous position of the damping control element. The arriving signal is processed in such a way that, upon reaching a specific damping degree, the nonequivalent actuation of the switching transistors 21, 22 is possible. Upon the occurrence of overload or short circuit, which is detected by the current-sensing resistor 23 in the emitter line of the switching transistor 21, the switching circuit 2 renders the switching transistors 21, 22 on the output side nonconductive. The Zener diodes 24, 25, respectively interconnected between the zero conductor of the supply voltage and the terminals A and R, protect the circuit from voltage peaks, and the diode 26, connected in the zero conductor, affords protection against inadvertent wrong direction (confusing the poles) by the user. The capacitors 27, 28 and 29 perform smoothing and, respectively, delay tasks, as components of the electronic circuit. The resistor 30 in the supply voltage line protects the electronic circuitry from destruction by voltage peaks. The main part with the circuit according to FIG. 4 constitutes a dc voltage switch with nonequivalent, n-switching outputs.

The circuit according to FIG. 5 is of a similar structure, but represents a dc voltage switch with nonequivalent, p-switching outputs.

In the embodiment of the main part 1 according to FIG. 6, a constant dc voltage, independent of the switching condition of the output transistor 33, is obtained for the operation of the switching circuit 34 and of the dc/ac converter 5 by way of a voltage control 31 and a storage capacitor 32. The converter 5 produces an ac voltage transmitted in the manner of a transformer through the housing to the plug-in adapter 2 and, respectively, to the sensor part 3. The reactive effect by the sensor part 3 is detected in the switching circuit 34, evaluated, and transformed into a switching signal to activate the transistor 33. The latter is controlled in such a way that, even in the conductive condition, there will always be applied to the capacitor 32 a voltage adequate for operating the circuit. Unduly high switching currents are detected by the switching circuit 34 by way of the current-sensing resistor 34. Such nonpermissible switching currents lead to turning off of the switching transistor 33. The circuit is supplied by a source of ac voltage, e.g. with mains voltage, by way of the diode bridge 36 so that ac voltage operation is likewise possible. A varistor 37 offers adequate protection against voltage peaks.

We claim:

1. Proximity switch operating in a noncontact fashion with a dc circuit arrangement lying between an input section and a sensor field generator, the dc circuit arrangement being divided into a main part disposed on a basic housing on a terminal side and a sensor part including the sensor field generator, a plug-in adapter including a plug-in socket for the sensor part a plug-in cable provided on the sensor part, an ac/dc converter with a core coil connected in front thereof arranged in the plug-in adapter, and the plug-in adapter being associated with a dc/ac converter located in the basic housing of the main part and including a core coil connected thereafter, the core coils lying in each case behind the mounting sides of the basic housing of the main part and of the plug-in adapter and transmitting, by inductive coupling, energy from the main part to the connected sensor part and the signals from the sensor part to the main part.

2. Proximity switch according to claim 1, wherein the housing of the plug-in adapter includes a base plate attachable to the basic housing and a truncated cone integrally formed at a rear side of the base plate and surrounding the plug-in socket; and wherein the plug-in socket and a plug of the plug-in cable are fashioned as connector plugs that can be threaded together.

3. Proximity switch according to one of claims 1 or 2, wherein the plug-in adapter includes a smoothing capacitor connected after the ac/dc converter.

4. A proximity switch according to claim 1, wherein the basic housing of the main part is provided, at a mounting side thereof, with a dovetail hookup recess; and wherein the plug-in adapter includes a square head on a mounting side thereof, said square head being undercut on all sides and insertable in the dovetail hookup recess.

5. A proximity switch according to claim 4, wherein an open end of the dovetail hookup recess can be closed by a pressure member extending over the square head of the plug-in adapter and can be attached by threading.

* * * * *